(12) United States Patent
Embabi et al.

(10) Patent No.: US 7,554,380 B2
(45) Date of Patent: Jun. 30, 2009

(54) SYSTEM FOR REDUCING SECOND ORDER INTERMODULATION PRODUCTS FROM DIFFERENTIAL CIRCUITS

(75) Inventors: Sherif H. K. Embabi, Plano, TX (US); Alan R. Holden, McKinney, TX (US); Jason P. Jaehnig, Dallas, TX (US); Abdellatif Bellaouar, Richardson, TX (US)

(73) Assignee: Icera Canada ULC, Waterloo, Ontario (CA)

( * ) Notice: Subject to any disclaimer, the term of this patent is extended or adjusted under 35 U.S.C. 154(b) by 75 days.

(21) Appl. No.: 11/298,667

(22) Filed: Dec. 12, 2005

(65) Prior Publication Data

US 2007/0132500 A1 Jun. 14, 2007

(51) Int. Cl.
*G06G 7/16* (2006.01)
(52) U.S. Cl. .................... 327/356; 327/359; 327/407
(58) Field of Classification Search ............... 327/407, 327/415, 416, 355–357, 359
See application file for complete search history.

(56) References Cited

U.S. PATENT DOCUMENTS

| | | | | |
|---|---|---|---|---|
| 5,726,597 | A * | 3/1998 | Petty et al. | 327/307 |
| 6,242,963 | B1 * | 6/2001 | Su et al. | 327/359 |
| 6,590,438 | B1 * | 7/2003 | Manku et al. | 327/359 |
| 6,639,446 | B2 * | 10/2003 | Komurasaki et al. | 327/355 |
| 6,750,704 | B1 | 6/2004 | Connell et al. | |
| 6,859,085 | B2 | 2/2005 | Watanabe et al. | |
| 6,871,057 | B2 * | 3/2005 | Ugajin et al. | 455/323 |
| 7,109,795 | B2 * | 9/2006 | van Zeijl | 330/254 |
| 2003/0155959 | A1 | 8/2003 | Belot et al. | |
| 2004/0209588 | A1 * | 10/2004 | Bargroff | 455/313 |
| 2004/0259519 | A1 | 12/2004 | Su | |
| 2006/0261875 | A1 * | 11/2006 | Breems et al. | 327/359 |
| 2007/0126491 | A1 * | 6/2007 | Woo et al. | 327/359 |

OTHER PUBLICATIONS

PCT Patent Application No. PCT/CA2006/001986, International Preliminary Report on Patentability dated Jun. 26, 2008.

* cited by examiner

*Primary Examiner*—Tuan Lam
(74) *Attorney, Agent, or Firm*—Eaton Peabody Patent Group LLC; Dennis R. Haszko (57) ABSTRACT

A passive CMOS differential mixer circuit with a mismatch correction circuit for balancing the electrical characteristics of the two output paths. Once the output paths of the differential circuit are balanced, or matched as closely as possible, second order intermodulation product generation can be inhibited or at least reduced to acceptable levels. The mismatch correction circuit receives a digital offset signal, and generates one or more voltage signals to be selectively applied to the signal paths of the passive differential mixer circuit. The voltage signals can be adjusted back gate bias voltages applied to the bulk terminals of selected transistors to adjust their threshold voltages, or the voltage signals can be adjusted common mode voltages applied directly to a selected signal path. Since the differential mixer circuit is passive, no DC current contribution to noise is generated. The switching transistors of the mixer circuit can be maintained at minimal dimensions to reduce switching signal drive loading, resulting in lower power consumption and higher operating frequencies than if larger switching transistors were used.

15 Claims, 8 Drawing Sheets

SYSTEM FOR REDUCING SECOND ORDER INTERMODULATION PRODUCTS FROM DIFFERENTIAL CIRCUITS

FIELD OF THE INVENTION

The present invention relates generally to communications, and to down-conversion of an RF signal to a lower frequency in a radio. More specifically, the present invention relates to passive mixers of direct-conversion receivers.

BACKGROUND OF THE INVENTION

Figure 1:
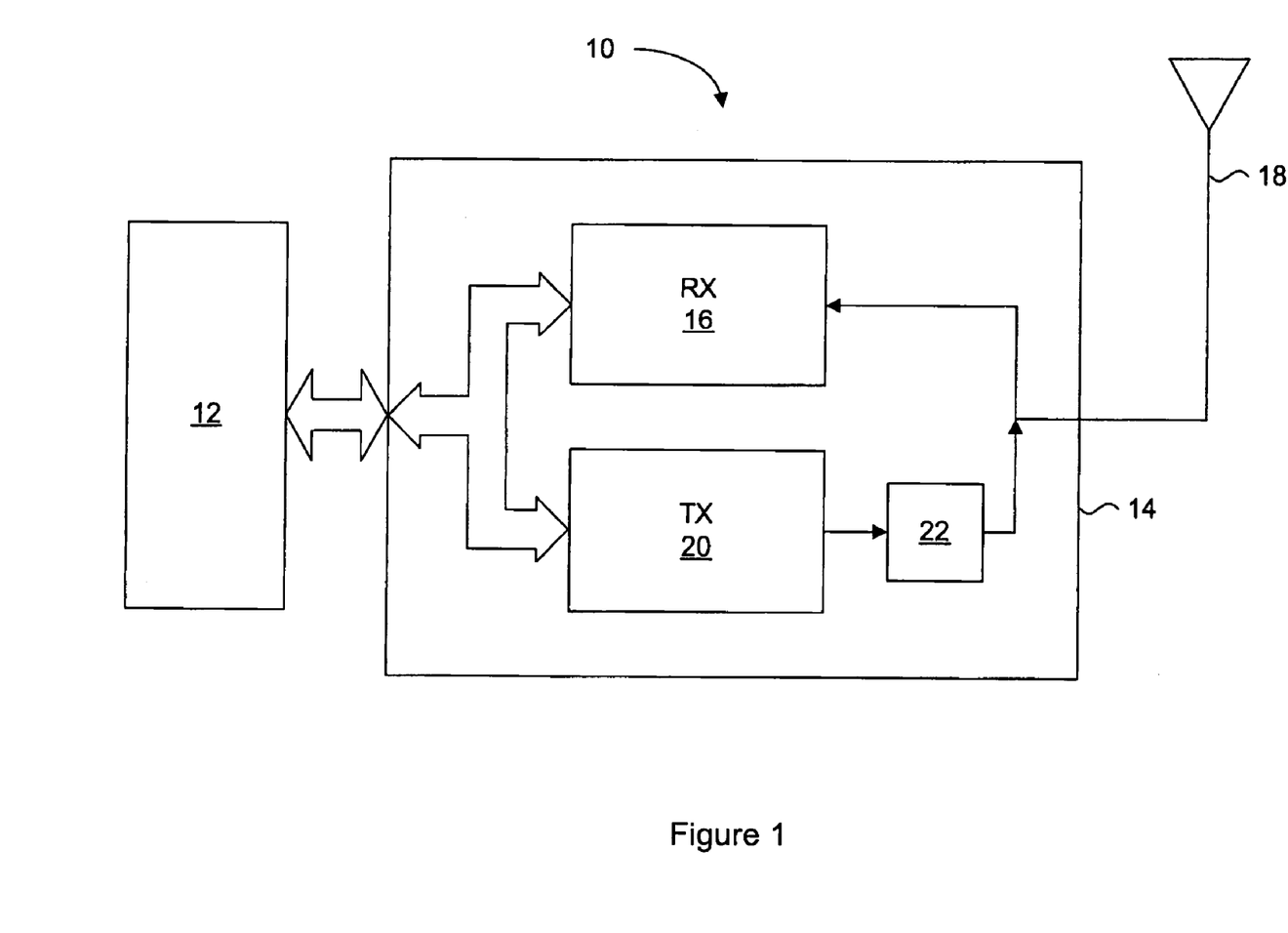
FIG. 1 is a block diagram of the core of a wireless device.

Wireless devices have been in use for many years for enabling mobile communication of voice and data. Such devices can include mobile phones and wireless enabled personal digital assistants (PDA's) for example. FIG. 1 is a generic block diagram of the core components of such wireless devices. The wireless core 10 includes a base band processor 12 for controlling application specific functions of the wireless device and for providing and receiving voice or data signals to a radio frequency (RF) transceiver chip 14. The RF transceiver chip 14 is responsible for frequency up-conversion of transmission signals, and frequency down-conversion of received signals. RF transceiver chip 14 includes a receiver core 16 connected to an antenna 18 for receiving transmitted signals from a base station or another mobile device, and a transmitter core 20 for transmitting signals through the antenna 18 via a gain circuit 22. Those of skill in the art should understand that FIG. 1 is a simplified block diagram, and can include other functional blocks that may be necessary to enable proper operation or functionality.

Generally, the transmitter core 20 is responsible for up-converting electromagnetic signals from base band to higher frequencies for transmission, while receiver core 16 is responsible for down-converting those high frequencies back to their original frequency band when they reach the receiver, processes known as up-conversion and down-conversion (or modulation and demodulation) respectively. The original (or base band) signal, may be, for example, data, voice or video. These base band signals may be produced by transducers such as microphones or video cameras, be computer generated, or transferred from an electronic storage device. In general, the high frequencies provide longer range and higher capacity channels than base band signals, and because high frequency radio frequency (RF) signals can propagate through the air, they are preferably used for wireless transmissions as well as hard-wired or fibre channels.

All of these signals are generally referred to as radio frequency (RF) signals, which are electromagnetic signals; that is, waveforms with electrical and magnetic properties within the electromagnetic spectrum normally associated with radio wave propagation.

The receiver core 16 can include a receiver path consisting of a low noise amplifier, one or more mixers, filters, an analog-to-digital converter and a variable gain amplifier. This listing of components in receiver core is not comprehensive, and any person of skill in the art will understand that the specific configuration will depend on the communication standard being adhered to and the chosen architecture implementation.

Several different receiver architectures are known, such as super-heterodyne, image rejection, direct conversion, near zero-IF conversion and harmonic mixing architectures. The direct conversion architecture performs RF to base band frequency translation in a single step. The RF signal is mixed with a local oscillator at the carrier frequency, therefore there is no image frequency, and no image components to corrupt the signal, which prove problematic for the other architectures.

An important component of the receiver path is the mixer circuit that is responsible for modulating (down converting or upconverting) an input RF signal to the base band frequency clock. Ideally, the mixer circuit is an ideal linear circuit, meaning that the relationship between the input of the circuit and the output of the circuit is linear.

Figure 2:
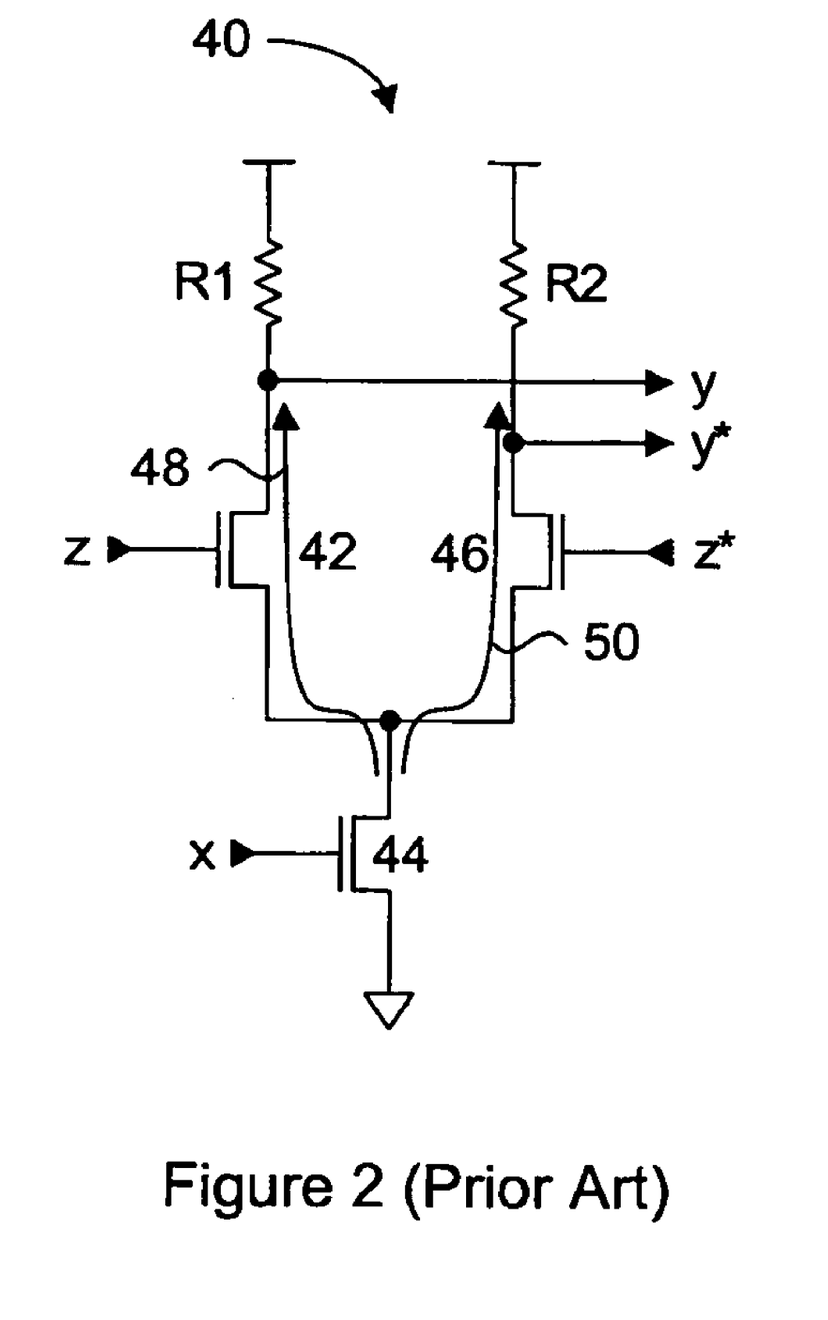
FIG. 2 is a circuit schematic of a prior art active mixer circuit.

An example of a known differential mixer circuit is shown in FIG. 2. Differential pair mixer circuit 40 is an active mixing circuit, which includes a load resistor R1 and n-channel transistor 42 connected in series between a voltage supply VCC and a drain terminal of input n-channel transistor 44, and a load resistor R2 and n-channel transistor 46 connected in series between VCC and the same drain terminal of input n-channel transistor 44. The gate terminal of n-channel transistor 42 receives the signal z, and the gate terminal of n-channel transistor 44 receives the complement of the signal z denoted as z*. The gate terminal of input n-channel transistor 44 receives RF input signal x, and its source terminal is connected to VSS. The resulting complementary output signals y and y* are taken from the drain terminals of n-channel transistors 42 and 46 respectively. One output path 48 of mixer circuit 40 is between the drain of input n-channel transistor 44 and the node y, while the other output path 50 is between the drain of input n-channel transistor 44 and the node y*.

A problem with this circuit lies in the non-linear nature of input transistor 44, which will generate an output y/y* having undesired intermodulation products. The current "I" through input transistor 44 can be expressed in equation (1) below:

$$I = g_m * Vx, \text{ where } g_m \text{ is the transconductance and } Vx \text{ is the voltage of input signal } x \quad (1)$$

However, since $g_m$ of transistor 44 is a non-linear, the actual current "I" will be expressed by equation (2):

$$I = a_1 Vx + a_2 Vx^2 + a_3 Vx^3 + a_4 Vx^4 \cdots \quad (2)$$

where $a_1$, $a_2$, $a_3$ and $a_4$ are coefficients, and terms from $a_2$ and on are considered nth order intermodulation products.

Figure 3A:
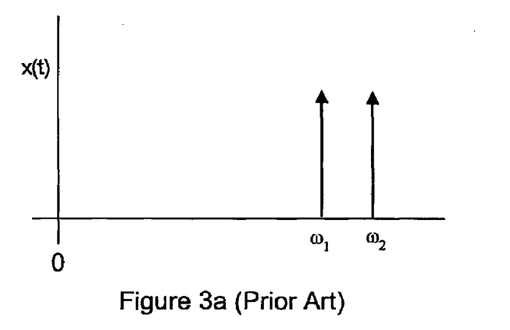
FIGS. 3a, 3b and 3c are power spectrum plots illustrating second order tones resulting from a direct conversion operation.
Figure 3B:
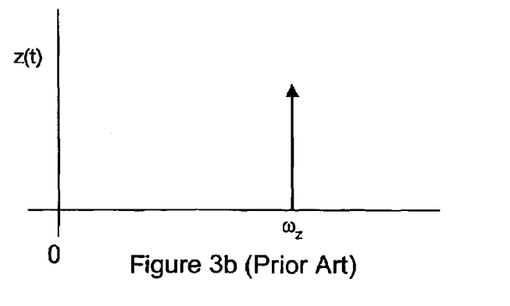
Figure 3C:
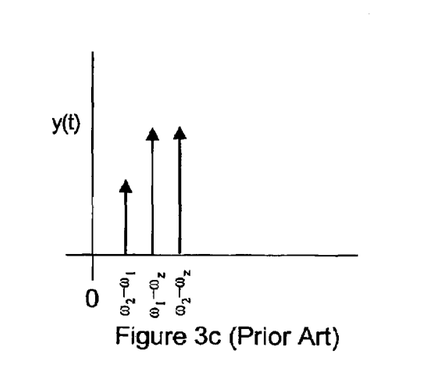

The effect of the intermodulation products can be seen in the output y(t) of the mixer circuit 40 downconverted to baseband by z(t), which has a large frequency component at the RF signal frequency. FIG. 3a shows an input signal, x(t) made up of two tones $\omega_1$ and $\omega_2$. FIG. 3b shows the signal z(t), having a frequency tone at $\omega_z$ used to down convert the signal x(t). After down conversion, the tones $\omega_1$ and $\omega_2$ are displaced by $\omega_z$. FIG. 3c shows the displacement of $\omega_1$ and $\omega_2$ as $\omega_1$-$\omega_z$ and $\omega_2$-$\omega_z$ respectively. The tone $\omega_1$-$\omega_2$ is generated by the second order term in equation (2). This tone effectively degrades the SNR of the radio. Thus, to mitigate the effect of second order intermodulation products, the linear relationship is ideally maintained by ensuring that all coefficients other than $a_1$ are zero, so that those terms will disappear.

However, because mixer circuit 40 is a differential-type circuit, the $a_2$ coefficient should be inherently reduced to zero. Differential circuits such as the one shown in FIG. 2 gernerally have two complementary data paths that should inherently cancel out any distortion components that may be introduced in them. Generally, differential-type circuits will set all even order terms $a_2$, $a_4$, $a_6$ etc.=0.

In practice however, the even order terms will cancel only if the two complementary data paths are identically matched. In mixer circuit 44 of FIG. 2 for example, the even order terms will cancel the characteristics of both resistors R1 and R2 are identical (ie. R1=R2), the electrical characteristics of both transistors 42 and 46 are identical, and the connections between transistor 44 to 42 and 44 to 46 are identical. In this situation can both data paths can be considered matching. Therefore the second order intermodulation products should be inherently cancelled out.

However, this situation is ideal, and in practice the two data paths 48 and 50 are not electrically identical to each other. Semiconductor circuit layout and/or slight process variations and/or anomalies across the chip can introduce mis-match between the two paths. With reference to FIG. 2, the two load resistors can have slightly different values, or transistors 42 and 46 can have slightly differing doping levels or dimension differences, or un-balanced parasitic capacitance on the connections between the transistors, are sufficient to cause mis-match in the paths. This mis-match can cause the second order intermodulation products to appear. The data path mismatch can be compensated for by trimming one or both load resistors, or by digitally switching in different valued resistors that are pre-formed on the chip. This is typically done during testing of the fabricated devices by detecting and measuring the amplitudes of the second order intermodulation products, and then selecting the appropriate resistor that minimizes the magnitude of the second order intermodulation products.

Another known scheme of minimizing second order intermodulation products is balancing, or matching, the complementary output paths of a mixer by directly adding or removing current from one of the paths. This is shown with reference to the differential mixer 60 shown in FIG. 4.

Figure 4:
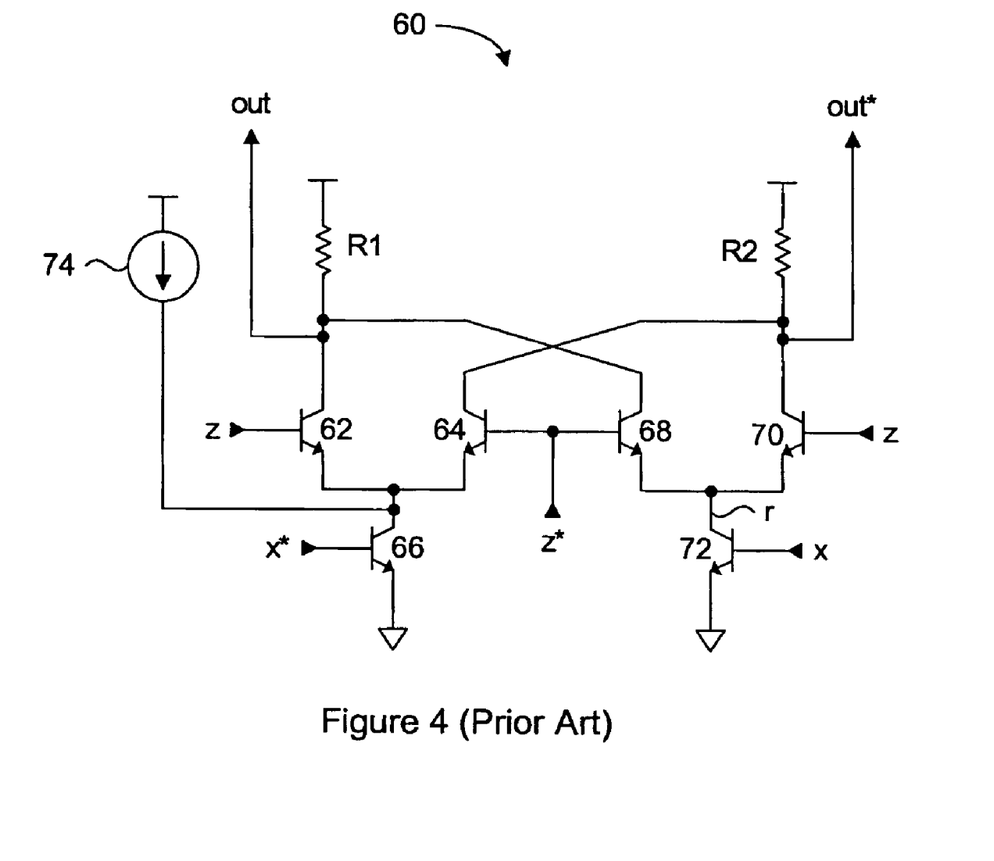
FIG. 4 is a circuit schematic of another prior art active bipolar differential mixer circuit.

Differential mixer 60 of FIG. 4 is substantially similar to the differential pair mixer circuit 40 shown in FIG. 2, but is configured to be responsive to both phases of the input signal x (x and x*), whereas the circuit of FIG. 2 is only responsive to a single phase of input signal x. Differential mixer 60 is effectively two differential pair type mixer circuits merged together. The first differential pair circuit includes a shared load resistor R1, bipolar transistor 62, bipolar transistor 64, bipolar transistor 66, and shared load resistor R2. Shared load resistor R1 and bipolar transistor 62 are serially connected between VCC and the collector terminal of bipolar transistor 66. Shared load resistor R2 and bipolar transistor 64 are serially connected between VCC and the collector terminal of bipolar transistor 66. Bipolar transistor 66 has a base terminal for receiving input signal x* and an emitter connected to VSS. The base terminal of bipolar transistor 62 receives signal z while the base terminal of bipolar transistor 64 receives z*, the opposite phase of signal z. Output signal OUT is generated from the collector terminal of bipolar transistor 62.

The second differential pair circuit includes a shared load resistor R2, bipolar transistor 68, bipolar transistor 70, bipolar transistor 70, and shared load resistor R2. Shared load resistor R2 and bipolar transistor 70 are serially connected between VCC and the collector terminal of bipolar transistor 72. Shared load resistor R1 and bipolar transistor 68 are serially connected between VCC and the collector terminal of bipolar transistor 72. Bipolar transistor 72 has a base terminal for receiving input signal x, being the opposite phase of x*, and an emitter connected to VSS. The base terminal of bipolar transistor 70 receives signal z while the base terminal of bipolar transistor 68 receives z*. Output signal OUT* is generated from the collector terminal of bipolar transistor 70.

The operation of differential mixer 60 is straightforward. When z is at a high voltage level, transistors 62 and 70 will be turned on, while transistors 64 and 68 are turned off. Conversely, when z* is at a high voltage level, transistors 64 and 68 will be turned on, while transistors 62 and 70 are turned off. Meanwhile, transistors 66 and 72 will turn on and off according to the level of input signal x/x*. Therefore, transistors 66 and 72 are alternately coupled to out and out* as signal z oscillates at a predetermined frequency. To correct for any mismatch in the output paths, a compensation circuit consisting of a programmable current source 74 can be connected between VCC and collector terminal of bipolar transistor 62. This current source can be digitally switched in from a bank of different current sources. Alternately, programmable current source 74 can be coupled to input node "r" in the circuit.

As previously shown in FIG. 4, the mixer circuit can be fabricated using bipolar technology, or SiGe, GaAs, and other heterojunction technologies. These technologies provide certain advantages for RF circuits, but are relatively new, very complex, and hence expensive. Consequently, the costs for manufacturing these RF devices can be prohibitive. Complementary Metal Oxide Semiconductor (CMOS) technology on the other hand, is a very mature and inexpensive fabrication process for the production of semiconductor devices.

Unfortunately, direct replacement of the bipolar transistors with CMOS transistors in the mixer circuits of FIG. 4 will add significant noise, which is undesirable. More specifically, since the transistors of the mixer circuits will constantly switch on and off, significant DC current will flow through them. This DC current will add significant amounts of noise, which will degrade the SNR of the receiver.

Even if the level of noise could be reduced to tolerable levels, the circuit path mismatch issues would still apply and may result in the generation of the second order intermodulation products. One solution is to ensure that the layout of the circuit paths are symmetrical and matched. However, potential CMOS transistor mismatch can contribute to circuit path mismatch even in a symmetrical circuit layout. This is primarily due to threshold voltage variations of the transistors. Tight transistor threshold voltage control is more easily obtained with larger sized transistors, however, larger sized transistors impose bandwidth limitations in addition to increased power consumption.

It is, therefore, desirable to provide a low cost, low noise CMOS mixer circuit with minimized even order intermodulation products caused by circuit path mismatch.

SUMMARY OF THE INVENTION

It is an object of the present invention to obviate or mitigate at least one disadvantage of previous differential CMOS passive mixer circuits. In particular, it is an object of the present invention to balance the differential signal paths of a CMOS passive mixer circuit to reduce intermodulation products.

In a first aspect, the present invention provides a differential passive CMOS mixer for modulating an input signal with a clock signal. The mixer includes a first signal path, a second signal path, and a mismatch correction circuit. The first signal path has a first transistor for coupling the input signal to a first output node in response to the clock signal. The second signal path has a second transistor for coupling the input signal to a second output node in response to a complement of the clock signal. The mismatch correction circuit generates an offset voltage in response to an offset signal, the offset voltage being operatively connected to the first signal path for balancing electrical characteristics of the first signal path and the second signal path to minimize second order intermodulation products.

According to an embodiment of the present invention, the first signal path and the second signal path can have symmetrical layouts, and the mismatch correction circuit can include at least one digital to analog converter for generating the offset voltage in response to the offset signal. The offset signal is an n-bit word, where n can be any integer value greater than 0. The mismatch correction circuit includes a second digital to analog converter for generating a second offset voltage in response to a second offset signal. The mismatch correction circuit can include a first set of registers, a second set of registers and a multiplexor circuit. The first set of registers stores the n-bits of the offset signal, and the first set of registers provide the n-bits of the offset signal to the digital to analog converter. The second set of registers stores the n-bits of the second offset signal, and the second set of registers provide the n-bits of the second offset signal to the second digital to analog converter, where the offset signal and the second offset signal are received in sequence. The multiplexor circuit selectively couples the offset signal to the first set of registers and the second offset signal to the second set of registers. Alternately, the offset signal and the second offset signal can be received in parallel by the digital to analog converter and the second digital to analog converter.

In a further embodiment of the present aspect, the first transistor has a bulk terminal coupled to the offset voltage for adjusting a threshold voltage of the first transistor, and the second transistor has a bulk terminal coupled to the second offset voltage for adjusting a threshold voltage of the second transistor. Alternately, the offset voltage can be coupled directly to the first output node, where the offset voltage being a sum of a common mode voltage and an adjustment voltage, and the second offset voltage can be coupled directly to the second output node, where the second offset voltage being a sum of a common mode voltage and an adjustment voltage.

In yet another embodiment of the present aspect, the differential passive CMOS circuit can further include a third signal path and a fourth signal path. The third signal path has a third transistor for coupling a complement of the input signal to the first output node in response to the complement of the clock signal. The fourth signal path has a fourth transistor for coupling the complement of the input signal to the second output node in response to the clock signal. The mismatch correction circuit further generates a second offset voltage, a third offset voltage and a fourth offset voltage in response to the offset signal. The second offset voltage can be coupled to the bulk terminal of the second transistor, the third offset voltage can be coupled to the bulk terminal of the third transistor, and the fourth offset voltage can be coupled to the bulk terminal of the fourth transistor. Alternately, the mismatch correction circuit further generates a second offset voltage in response to the offset signal, the offset voltage being coupled directly to the first output node and the second offset voltage being coupled directly to the second output node. Alternately, the mismatch correction circuit further generates a second offset voltage in response to the offset signal, the offset voltage being coupled to the input signal, and the second offset voltage being coupled to the complement of the input signal.

In a second aspect, the present invention provides a differential passive CMOS mixer. The differential passive CMOS mixer includes a first transistor and a second transistor connected in parallel to a first common input terminal, a third transistor and a fourth transistor connected in parallel to a second common input terminal, a first offset voltage, a second offset voltage, a third offset voltage, and a fourth offset voltage. The first transistor is controlled by a clock signal and the second transistor is controlled by a complement of the clock signal. The third transistor is controlled by the complement of the clock signal and the fourth transistor is controlled by the clock signal. The first transistor and the third transistor are connected in parallel to a first common output terminal and the second transistor and the fourth transistor are connected in parallel to a second common output terminal. The first offset voltage is coupled to the first transistor bulk terminal for setting the threshold voltage of the first transistor. The second offset voltage is coupled to the second transistor bulk terminal for setting the threshold voltage of the second transistor. The third offset voltage is coupled to the third transistor bulk terminal for setting the threshold voltage of the third transistor. The fourth offset voltage is coupled to the fourth transistor bulk terminal for setting the threshold voltage of the fourth transistor.

In an embodiment of the present aspect, the first offset voltage, the second offset voltage, the third offset voltage, and the fourth offset voltage are generated by a mismatch correction circuit in response to an n-bit offset signal, where n is an integer value greater than 0. The mismatch correction circuit can include a first digital to analog converter, a second digital to analog converter, a third digital to analog converter and a fourth digital to analog converter. The first digital to analog converter generates the first offset voltage in response to a first i-bit signal. The second digital to analog converter generates the second offset voltage in response to a second i-bit signal. The third digital to analog converter generates the third offset voltage in response to a third i-bit signal. The fourth digital to analog converter generates the fourth offset voltage in response to a fourth i-bit signal. The n-bit offset signal includes the first to the fourth i-bit signals, where i is an integer value greater than 0.

In a third aspect, the present invention provides a method for correcting differential output mismatch in a passive CMOS mixer circuit by applying a combination of offset voltages. The method includes applying a default combination of offset voltages to the mixer circuit; measuring an IIP2 value of the mixer circuit; comparing the IIP2 value to a predetermined value; applying a new combination of offset voltages to the mixer circuit if the measured IIP2 value does not meet the predetermined value; and repeating steps b) to d) until the measured IIP2 value is at least the predetermined value.

According to embodiments of the present aspect, the default combination of offset voltages corresponds to a default offset code, and each new combination of offset voltages corresponds to a new offset code. The combination of offset voltages includes n offset voltages coupled to corresponding bulk terminals of n transistors in the mixer circuit, where n is an integer value greater than zero. Alternately, the combination of offset voltages includes two offset voltages coupled to one of differential output terminals and differential input terminals of the mixer circuit.

Other aspects and features of the present invention will become apparent to those ordinarily skilled in the art upon review of the following description of specific embodiments of the invention in conjunction with the accompanying figures.

BRIEF DESCRIPTION OF THE DRAWINGS

Embodiments of the present invention will now be described, by way of example only, with reference to the attached Figures, wherein.

DETAILED DESCRIPTION

Generally, the present invention provides a passive CMOS differential mixer circuit with a mismatch correction circuit for balancing the electrical characteristics of the two output paths. Once the output paths of the differential circuit are balanced, or matched as closely as possible, second order intermodulation product generation can be inhibited or at least reduced to acceptable levels. The mismatch correction circuit receives at least one n-bit digital offset signal, to generate one or more corresponding voltages. The generated voltages are applied to the differential mixer circuit to balance its electrical characteristics.

According to embodiments of the present invention, the voltage signals can be applied to the back gate bias voltages of selected transistors of the circuit to adjust their threshold voltages such that they all match. Alternately, the voltage signals can adjust common mode voltages applied directly to a selected signal path to ensure that their electrical characteristics match. The aforementioned embodiments of the present invention can be applied to a passive differential mixer circuit, where no DC current contribution to noise is generated. The switching transistors of the passive mixer circuit can be maintained at minimal dimensions to reduce switching signal drive loading, resulting in lower power consumption and higher operating frequencies than if larger switching transistors were used.

Figure 5:
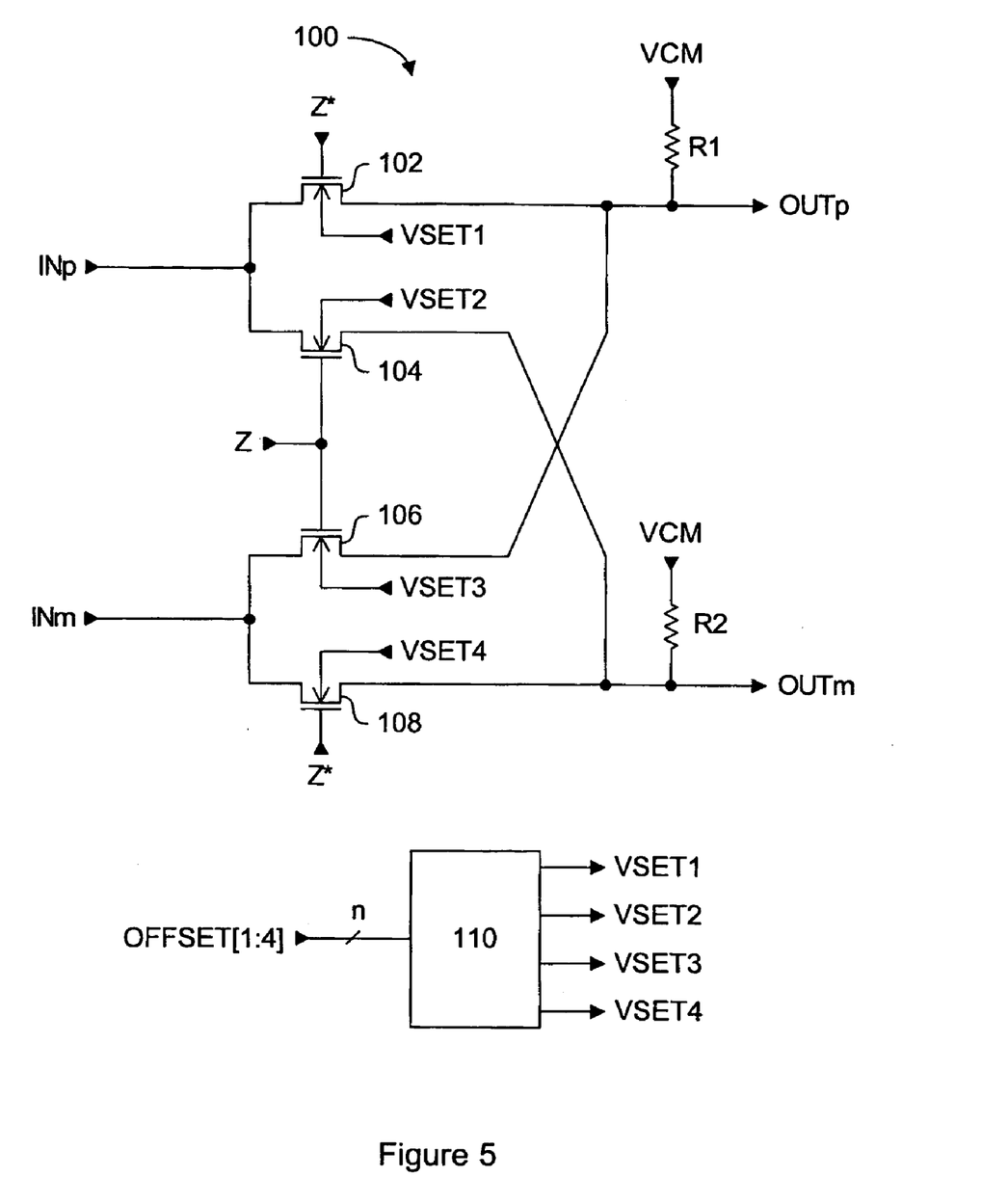
FIG. 5 is a circuit schematic of a passive differential CMOS mixer circuit with transistor bulk compensation, according to an embodiment of the present invention.

FIG. 5 is a circuit schematic of a differential passive CMOS mixer circuit according to an embodiment of the present invention. In the presently shown embodiment, the threshold voltages of the mixer circuit transistors can be matched to reduce or eliminate second order intermodulation product generation. For example, a nominal threshold voltage may be desired for a minimally sized transistor, but due to manufacturing, the resultant transistor threshold voltages can vary. Alternately, other circuit components can unbalance the circuit, and the threshold voltages can be individually set to values sufficient to maintain balance. In otherwords, the illustrated embodiment of FIG. 5 will adjust the threshold voltages to the nominal value, or any desired preselected value.

The circuit of FIG. 5 is similar to the circuit of FIG. 2, in that it is a dual differential configuration for acting on both phases of the RF input signal IN. The differential passive CMOS mixer circuit 100 includes a first differential pair consisting of nmos transistors 102 and 104, and a second differential pair consisting of nmos transistors 106 and 108. This circuit is passive because there are no DC currents generated through transistors 102 to 108, due to the absence of the VCC and VSS supplies connected to them. Since the circuit is passive, resistors R1 and R2 are coupled to output nodes OUTp and OUTm for setting a common mode voltage VCM.

Transistors 102 and 104 have a common source terminal for receiving one phase of the input signal INp, but the drain terminal of transistor 102 is coupled to output node OUTp and the drain terminal of transistor 104 is coupled to output node OUTm. OUTp and OUTm are the two phases of the output signal OUT. The gate terminal of transistor 102 receives signal frequency signal z* while the gate terminal of transistor 104 receives the complementary frequency signal z. The layout of the first differential pair is preferably balanced and matched, meaning that the physical characteristics of the conductor lines carrying OUTp and OUTm are matched. For example, the geometry of the conductor lines should be substantially identical to each other. A first signal path begins from the source terminal of transistor 102, through transistor 102, to the output node OUTp, via conductor lines. Similarly, a second signal path is formed from the source terminal of transistor 104, through transistor 104, to the output node OUTm, via conductor lines.

The second differential pair is similarly configured to the first differential pair. Transistors 106 and 108 have a common source terminal for receiving the other phase of the input signal INm, but the drain terminal of transistor 106 is coupled to output node OUTp and the drain terminal of transistor 108 is coupled to output node OUTm. The gate terminal of transistor 106 receives signal z while the gate terminal of transistor 108 receives the complementary signal z*. The layout of the second differential pair is also symmetrical with respect to its first and second signal paths, and with respect to the signal paths of first differential pair.

Transistors 102, 104, 106 and 108 of mixer circuit 100 can have mismatched threshold voltages This mis-match can be compensated for by independently controlling the back gate bias voltage of transistors 102, 104, 106 and 108. According to an embodiment of the present invention, a mismatch correction circuit 110 is provided to generate specific back gate bias voltages for each of transistors 102, 104, 106 and 108. In FIG. 5, mismatch correction circuit 110 receives an n-bit digital offset signal, and generates the four back gate bias voltages, VSET1, VSET2, VSET3 and VSET4, which are coupled to the back gate bias connection of transistors 102, 104, 106 and 108 respectively. Voltages VSET1, VSET2, VSET3 and VSET4 can be set to the same preselected default value, and then individually adjusted as required. Voltages VSET1, VSET2, VSET3 and VSET4 will fine tune the threshold voltage of the transistor it is coupled to, and therefore adjust the electrical characteristic of its corresponding signal path.

Figure 5A:
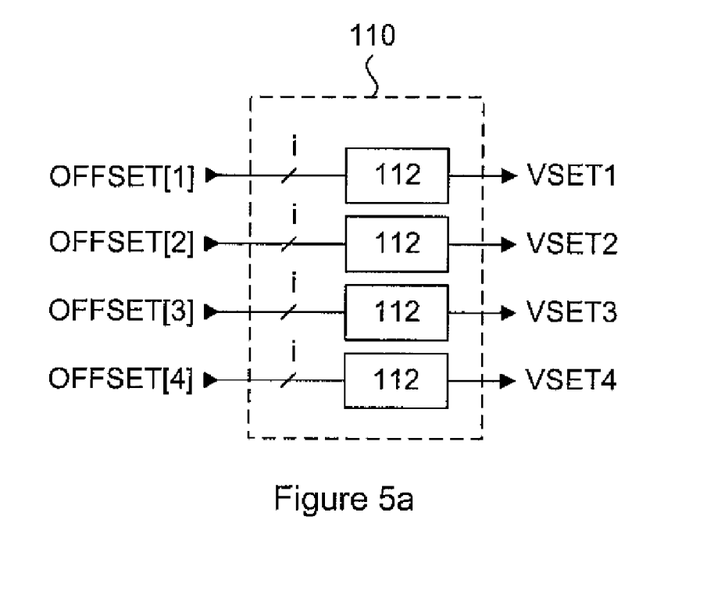
FIG. 5a is a circuit schematic of a mismatch correction circuit.
Figure 5B:
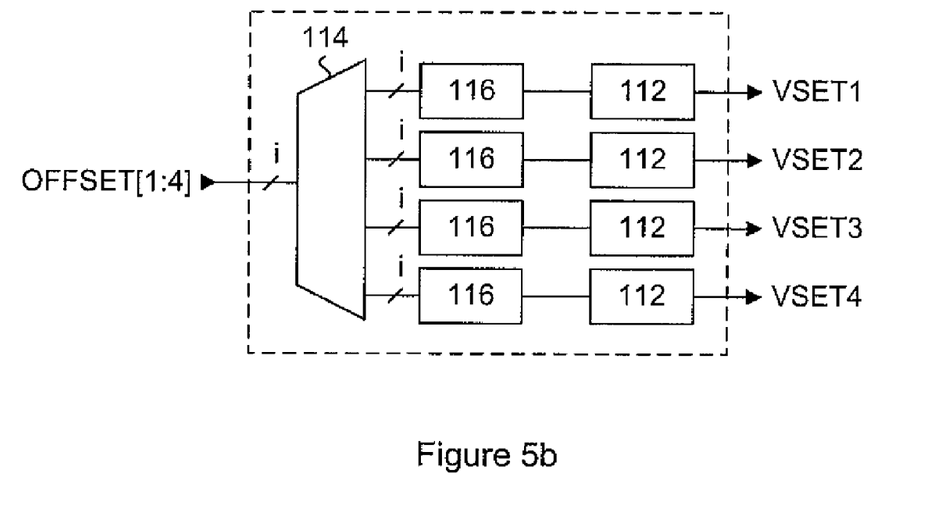
FIG. 5b is a circuit schematic of an alternate mismatch correction circuit.

Mismatch correction circuit 110 can include four individual digital to analog converter circuits (DAC), each generating one offset voltage in response to an i-bit signal. In FIG. 5, mismatch correction circuit 110 receives four such i-pit signals, OFFSET[1], OFFSET[2], OFFSET[3] and OFFSET[4], labelled collectively as n-bit signal OFFSET[1:4]. Variable "i" can be selected to be any desired integer number, depending upon the desired resolution and control of the offset voltage level. For example, the offset voltage can be increased or decreased by 15 millivolts, in increments of 0.5 millivolts. Therefore, if each DAC circuit is configured with an i-bit resolution, OFFSET[1:4] would be n=4*i bits if all the DAC circuits are to simultaneously receive their respective i-bit signals. FIG. 5a is schematic illustrating one embodiment of mismatch correction circuit 110. Mismatch correction circuit 110 of FIG. 5a includes four DAC's 112, each receiving a different i-bit offset signal. To minimize wide bussing that will consume silicon area, the input bus to mismatch correction circuit 110 can be limited to i-bits in width, and the i-bit offset signals are provided sequentially. FIG. 5b is a schematic illustrating a second embodiment of mismatch correction circuit 110. For this configuration, the mismatch correction circuit 110 can include a multiplexor circuit 114 and sets of registers 116 for storing each digital offset signal prior to conversion into an analog signal by DAC's 112. Persons skilled in the art will understand that each set of registers 116 includes individual registers for storing i-bits of data. Those of skill in the art should understand that the arrangement and control of such circuits is straightforward to implement. Signal OFFSET can be provided by the base band processor, fuse-programmed, or generated by any suitable means.

Now a discussion of how the offset voltage is selected follows.

As previously described, an n-bit digital OFFSET[1:4] signal is fed into DAC circuits of the mismatch correction circuit. Each DAC can generate a distinct and desired voltage, where the desired voltage can be viewed as a base voltage plus or minus an adjustment, or offset voltage. The relationship of a DAC code to an offset signal will be discussed later.

A mismatch in the signal path can be detected during chip testing, and can be quantified as an IIP2 value. IIP2 is a standard measure known to those of skill in the art, where a high IIP2 value is preferred. Mathematically, an IIP2 value is proportional to $a_1/a_2$, where $a_1$ and $a_2$ are the coefficients of the first two terms of the described non-linear function previously shown in equation 2. Therefore by minimizing $a_2$, the value of IIP2 can be maximized. Generally, a maximized IIP2 value is an indicator of substantially linear circuit operation.

Figure 6:
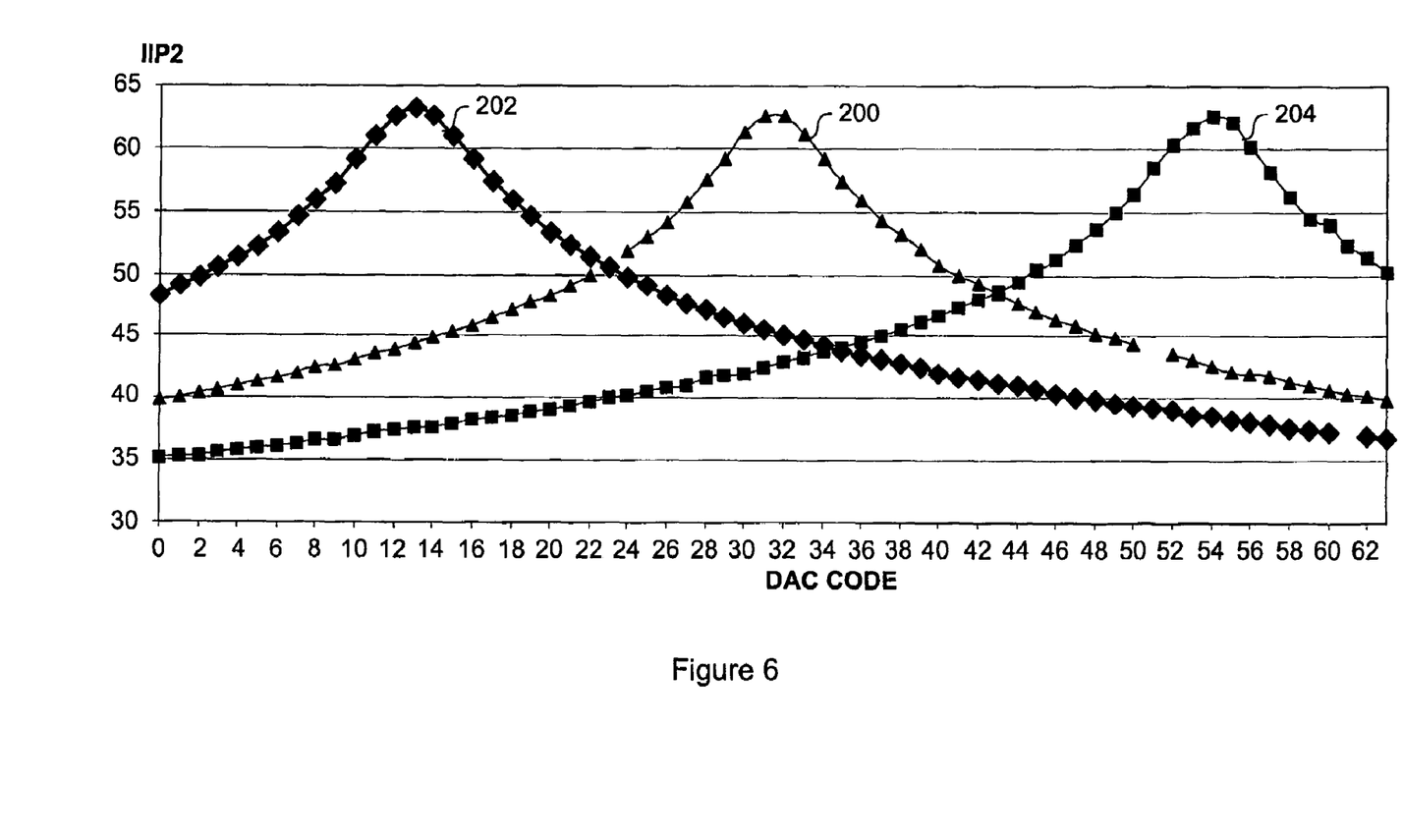
FIG. 6 is a plot of offset voltage code versus IIP2 for the passive differential CMOS mixer circuit shown in FIG. 5; and, FIG. 7 is a method of compensating for differential mixer output path mismatch, according to an embodiment of the present invention.

FIG. 6 is a plot of IIP2 versus DAC codes for the nmos differential passive mixer circuit shown in FIG. 5. Three example IIP2 curves are shown, where curve 200 corresponds to a balanced circuit with no signal path mismatch. Curve 200 has a peak IIP2 at DAC code 32, a default code corresponding to unadjusted voltage offset signals. In other words, the unadjusted voltage will be the base application voltage plus an adjustment voltage of zero. If IIP2 is measured to be a maximized value for DAC code 32, then the circuit is deemed to be substantially ideal and substantially linear in operation, and no mismatch correction is required.

Curves 202 and 204 correspond to circuits with positively and negatively mismatched signal paths, relative to substantially ideal circuit. In the presently shown example, it is assumed that curve 202 has a peak IIP2 shifted from the IIP2 peak of curve 200 by −15 mV. Conversely, it is assumed that curve 204 has a peak IIP2 shifted from the IIP2 peak of curve 200 by +15 mV. An IIP2 measurement with default DAC code 32 yielding a low IIP2 value indicates that the circuit has mismatching signal paths. Then by changing the DAC code in either direction of the default DAC code 32 and performing further IIP2 measurements, the testing system can quickly change the DAC code such that the maximum IIP2 measurement is obtained. For curve 202, the maximum IIP2 value occurs at DAC code 13. For curve 204, the maximum IIP2 value occurs at DAC code 54. Although IIP2 is proportional to $a_1/a_2$, the maximum IIP2 values are practically shown with finite limits, since an $a_2$ value of zero renders an infinitely large IIP2.

The DAC code numbers shown in the x-axis of FIG. 6 are decimal representations of corresponding i-bit offset signals which can be used in FIG. 5. More specifically, each i-bit offset signal can be received by one DAC circuit to generate a corresponding voltage signal. In FIG. 5 for example, if the resolution of each DAC is i=6 bits and all the DAC circuits receive their signals in parallel, then the total width of signal OFFSET[1:4] would be n=24 bits.

Therefore, with the circuits of FIG. 5, any mismatch in the signal paths of the differential passive CMOS mixer circuit 100 can be corrected, by the application of offset voltages directly to the components of the paths, and in particular. to the back gate bias of the transistors. Those of skill in the art will understand that there can be one mismatch correction circuit for each mixer circuit on a chip.

Figure 7:
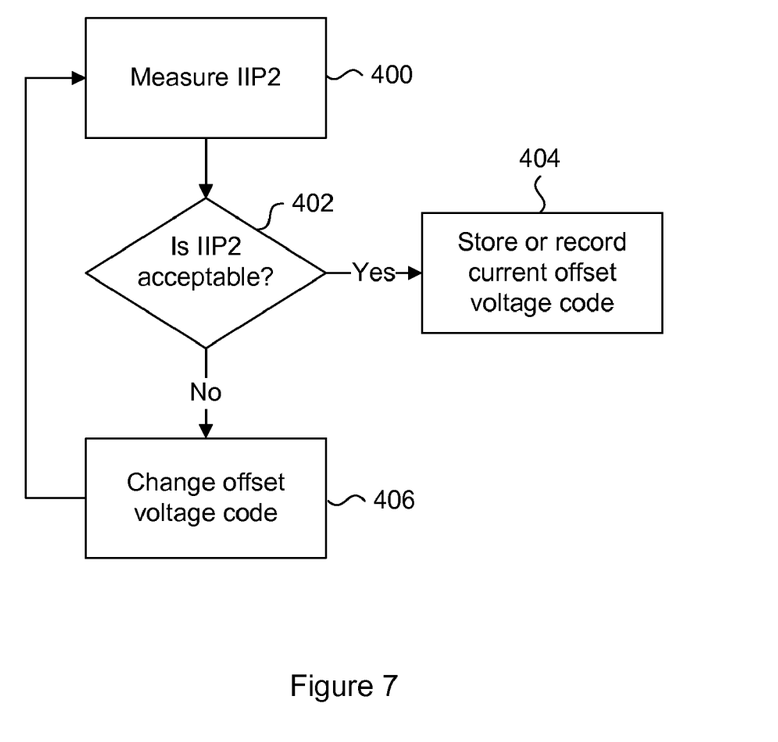

A method of circuit mismatch correction or calibration according to an embodiment of the present invention now follows with reference to the flow chart of FIG. 7. It is assumed that the wireless core has been fabricated, and a passive differential mixer circuit such as the one shown in FIG. 5 with a mismatch correction circuit 110, is now undergoing testing procedures. The following method can be easily integrated as another test routine.

The method starts at step 400, where a measure of the IIP2 of the mixer circuit is made. The initial measure is preferably executed with the default DAC code being applied. If the presently measured IIP2 is acceptable based on a predetermined level, then the method terminates at step 404 and the presently applied DAC code is stored or recorded. Otherwise, the method proceeds to step 406 where the offset code is changed. The method then loops back to repeat steps 400, 402 and 406 until IIP2 equals or exceeds the predetermined level. Additional intelligence can be built into the method of FIG. 7 to determine the proper direction to change the DAC code in. This is to ensure that each successive change in the DAC code will provide an IIP2 measurement that is better than the previous IIP2 measurement. This direction determination is only done once after the initial IIP2 measurement. If the second IIP2 measurement provides an IIP2 that is less than that of the previous DAC code, then the DAC code change should be reversed to provide offset voltages that should increase the IIP2 value.

In summary, the embodiments of the previously described invention will minimize or eliminate the second order intermodulation products in differential type circuits, resulting in a substantially linear operation. The passive differential design is especially advantageous for mixer circuit applications because the mixing transistors can be minimally sized, reducing power consumption by reducing the load of the circuits driving their gates. No DC current flows through the mixer transistors due to the passive design, minimizing noise in the circuit. The cost in current and silicon area consumption is low for implementing the embodiments of the invention.

While the circuit of FIG. 5 illustrates a dual differential mixer circuit configuration, the embodiments of the present invention will equally apply to a single differential mixer circuit configuration. For example, the mixer circuit of FIG. 5 can consist only of transistors 102 and 104, or transistors 106 and 108.

The presently illustrated embodiments show offset voltages being applied to the back gate bias connections of each mixer transistor, or to both output nodes of the circuit.

The above-described embodiments of the present invention are intended to be examples only. Alterations, modifications and variations may be effected to the particular embodiments by those of skill in the art without departing from the scope of the invention, which is defined solely by the claims appended hereto.

What is claimed is:

1. A differential passive CMOS mixer for modulating an input signal with a clock signal, comprising:
 a first signal path having a first transistor for coupling the input signal to a first output node in response to the clock signal;

a second signal path having a second transistor for coupling the input signal to a second output node in response to a complement of the clock signal; and, a mismatch correction circuit including at least one digital to analog converter for generating an offset voltage in response to an offset signal, the offset signal being an n-bit word where n can be any integer value greater than 0, the offset voltage being operatively connected to the first signal path for balancing electrical characteristics of the first signal path and the second signal path to minimize second order intermodulation products.

2. The differential passive CMOS mixer of claim 1, wherein the first signal path and the second signal path have symmetrical layouts.

3. The differential passive CMOS mixer of claim 1, wherein the mismatch correction circuit includes a second digital to analog converter for generating a second offset voltage in response to a second offset signal.

4. The differential passive CMOS mixer of claim 3, wherein the mismatch correction circuit further includes
   a first set of registers for storing the n-bits of the offset signal, the first set of registers providing the n-bits of the offset signal to the digital to analog converter,
   a second set of registers for storing the n-bits of the second offset signal, the second set of registers providing the n-bits of the second offset signal to the second digital to analog converter, the offset signal and the second offset signal being received in sequence, and
   a multiplexor circuit for selectively coupling the offset signal to the first set of registers and the second offset signal to the second set of registers.

5. The differential passive CMOS mixer of claim 3, wherein the offset signal and the second offset signal are received in parallel by the digital to analog converter and the second digital to analog converter.

6. The differential passive CMOS mixer of claim 1, wherein the first transistor has a bulk terminal coupled to the offset voltage for adjusting a threshold voltage of the first transistor.

7. The differential passive CMOS mixer of claim 3, wherein the second transistor has a bulk terminal coupled to the second offset voltage for adjusting a threshold voltage of the second transistor.

8. The differential passive CMOS mixer of claim 1, further including
   a third signal path having a third transistor for coupling a complement of the input signal to the first output node in response to the complement of the clock signal, and
   a fourth signal path having a fourth transistor for coupling the complement of the input signal to the second output node in response to the clock signal.

9. The differential passive CMOS mixer of claim 8, wherein the mismatch correction circuit further generates a second offset voltage, a third offset voltage and a fourth offset voltage in response to the offset signal, the second offset voltage being coupled to the bulk terminal of the second transistor, the third offset voltage being coupled to the bulk terminal of the third transistor, and the fourth offset voltage being coupled to the bulk terminal of the fourth transistor.

10. The differential passive CMOS mixer of claim 8, wherein the mismatch correction circuit further generates a second offset voltage in response to the offset signal, the offset voltage being coupled directly to an input node receiving the input signal and the second offset voltage being coupled directly a second input node receiving the complement of the input signal.

11. The differential passive CMOS mixer of claim 8, wherein the mismatch correction circuit further generates a second offset voltage in response to the offset signal, the offset voltage being coupled to the input signal, and the second offset voltage being coupled to the complement of the input signal.

12. A differential passive CMOS mixer comprising:
   a first transistor and a second transistor connected in parallel to a first common input terminal, the first transistor being free of DC current flow and controlled by a clock signal and the second transistor being free of DC current flow and controlled by a complement of the clock signal and;
   a third transistor and a fourth transistor connected in parallel to a second common input terminal, the third transistor being free of DC current flow and controlled by the complement of the clock signal and the fourth transistor being free of DC current flow and controlled by the clock signal, the first transistor and the third transistor being connected in parallel to a first common output terminal and the second transistor and the fourth transistor being connected in parallel to a second common output terminal;
   a first offset voltage coupled to the first transistor bulk terminal for setting the threshold voltage of the first transistor;
   a second offset voltage coupled to the second transistor bulk terminal for setting the threshold voltage of the second transistor;
   a third offset voltage coupled to the third transistor bulk terminal for setting the threshold voltage of the third transistor;
   a fourth offset voltage coupled to the fourth transistor bulk terminal for setting the threshold voltage of the fourth transistor; and
   a mismatch correction circuit having
      a first digital to analog converter for generating the first offset voltage in response to a first i-bit signal,
      a second digital to analog converter for generating the second offset voltage in response to a second i-bit signal,
      a third digital to analog converter for generating the third offset voltage in response to a third i-bit signal, and
      a fourth digital to analog converter for generating the fourth offset voltage in response to a fourth i-bit signal, the first to the fourth i-bit signals forming an n-bit offset signal where n and i are an integer values greater than 0.

13. A differential passive CMOS mixer for modulating an input signal with a clock signal, comprising:
   a first signal path having a first transistor for coupling the input signal to a first output node in response to the clock signal;
   a second signal path having a second transistor for coupling the input signal to a second output node in response to a complement of the clock signal; and,
   a mismatch correction circuit including at least one digital to analog converter for generating an offset voltage in response to an offset signal, the offset voltage being coupled to a bulk terminal of the first transistor for adjusting a threshold voltage of the first transistor for balancing electrical characteristics of the first signal path and the second signal path to minimize second order intermodulation products ,the offset signal being an n-bit word, where n can be any integer value greater than 0.

14. The differential passive CMOS mixer of claim 13, wherein the second transistor has a bulk terminal coupled to the second offset voltage for adjusting a threshold voltage of the second transistor.

15. The differential passive CMOS mixer of claim 14, wherein the mismatch correction circuit includes a second digital to analog converter for generating a second offset voltage in response to a second offset signal, the second offset signal being an n-bit word, where n can be any integer value greater than 0.

* * * * *

UNITED STATES PATENT AND TRADEMARK OFFICE
CERTIFICATE OF CORRECTION

| | |
|---|---|
| PATENT NO. | : 7,554,380 B2 |
| APPLICATION NO. | : 11/298667 |
| DATED | : June 30, 2009 |
| INVENTOR(S) | : Sherif H. K. Embabi et al. |

It is certified that error appears in the above-identified patent and that said Letters Patent is hereby corrected as shown below:

Title Page delete "15 Claims" and insert therefor -- 13 Claims --;

Column 11, lines 61 - 67, delete Claim 10; and

Column 12, lines 1 - 6, delete Claim 11.

Signed and Sealed this

Third Day of November, 2009

David J. Kappos
*Director of the United States Patent and Trademark Office*